(12) United States Patent
Parent et al.

(10) Patent No.: US 6,983,925 B2
(45) Date of Patent: Jan. 10, 2006

(54) ROTARY BARREL GATE VALVE

(75) Inventors: Donald G. Parent, Windham, ME (US); Dean Plaisted, Kennebunk, ME (US); Michael Asbas, Alfred, ME (US)

(73) Assignee: D2 In-Line Solutions, LLC, Gray, ME (US)

( * ) Notice: Subject to any disclaimer, the term of this patent is extended or adjusted under 35 U.S.C. 154(b) by 0 days.

(21) Appl. No.: 10/401,001

(22) Filed: Mar. 27, 2003

(65) Prior Publication Data

US 2003/0213929 A1  Nov. 20, 2003

Related U.S. Application Data

(60) Provisional application No. 60/368,818, filed on Mar. 29, 2002.

(51) Int. Cl.
*F16K 25/00* (2006.01)

(52) U.S. Cl. .................. 251/161; 251/192; 137/625.32
(58) Field of Classification Search ................ 251/161, 251/188, 192; 137/625.32
See application file for complete search history.

(56) References Cited

U.S. PATENT DOCUMENTS

| 1,442,452 | A | | 1/1923 | Taylor |
| 4,262,880 | A | * | 4/1981 | Danko et al. ............... 251/288 |
| 4,894,133 | A | | 1/1990 | Hedgcoth |
| 5,026,470 | A | | 6/1991 | Bonyhard et al. |
| 5,070,909 | A | * | 12/1991 | Davenport ............. 137/625.32 |
| 5,181,556 | A | | 1/1993 | Hughes |
| 5,244,554 | A | | 9/1993 | Yamagata et al. |
| 5,272,108 | A | | 12/1993 | Kozawa |
| 5,287,914 | A | | 2/1994 | Hughes |
| 5,525,369 | A | | 6/1996 | Blackwell et al. |
| 5,538,610 | A | | 7/1996 | Gesche et al. |
| 5,611,516 | A | * | 3/1997 | Reinicke et al. ............... 251/77 |
| 5,691,008 | A | | 11/1997 | Thoma et al. |
| 5,705,044 | A | | 1/1998 | Washburn et al. |
| 5,741,405 | A | | 4/1998 | Statnikov et al. |
| 5,759,616 | A | | 6/1998 | Michel et al. |
| 6,017,144 | A | | 1/2000 | Guo et al. |
| 6,029,948 | A | | 2/2000 | Shafer |
| 6,114,216 | A | | 9/2000 | Yieh et al. |
| 6,123,986 | A | | 9/2000 | Maschwitz et al. |
| 6,135,414 | A | * | 10/2000 | Mohtar ........................ 251/58 |
| 6,183,615 | B1 | | 2/2001 | Yasar et al. |
| 6,337,005 | B2 | | 1/2002 | Vanden Brande et al. |
| 6,407,012 | B1 | | 6/2002 | Miyasaka et al. |
| 6,517,692 | B1 | | 2/2003 | Zeberinsh |
| 2003/0055525 | A1 | | 3/2003 | Graham |
| 2003/0213432 | A1 | | 11/2003 | Parent et al. |

* cited by examiner

*Primary Examiner*—Edward K. Look
*Assistant Examiner*—John K. Fristoe, Jr.
(74) *Attorney, Agent, or Firm*—Iandiorio & Teska

(57) ABSTRACT

A rotary barrel gate valve includes a body and at least one passage through the body defining an inlet and an outlet. There is a first actuator for rotating the body, a second actuator for translating the body, and a sealing portion on the body which seals the body with respect to an opening into a chamber adjacent the body.

48 Claims, 7 Drawing Sheets

ROTARY BARREL GATE VALVE

RELATED APPLICATIONS

This application claims priority of and is related to U.S. Provisional Patent Application Ser. No. 60/368,818, filed Mar. 29, 2002. This application is also related to the U.S. Patent Application entitled GRAVITY-FED IN-LINE CONTINUOUS PROCESSING SYSTEM AND METHOD, filed on even date herewith and hereby incorporated by reference herein, and which also claims priority of U.S. Provisional Patent Application Ser. No. 60/368,818, filed Mar. 29, 2002.

FIELD OF THE INVENTION

This invention relates to a rotary barrel gate valve for rapidly opening, closing and sealing individual chambers including processing and vacuum chambers or load locks.

BACKGROUND OF THE INVENTION

Processing systems for applying coatings to substrates such as metallizing insulative substrates include electroplating, electroless plating, painting, arc-spray, evaporative vacuum metallization, sputter vacuum metallization, and vapor deposition. Such systems and processes involve opening and closing of access ports to a chamber by means of a portal or opening using gate valves. In most cases, opening and closing involves up and down motion or sliding motion of a gate valve. For example, before processing, a processing chamber is opened and parts to undergo processing are inserted into the chamber. The chamber door is then closed. Typically, in processes such as vacuum sputtering, the chamber door is sealed. Thereafter, coating of the parts takes place, and after coating, the chamber is opened, and the parts are removed from the processing chamber.

Typically, these steps are repeated many times, causing wear on the valves and necessitating their repair and replacement many times over the life of the system. Also, opening and closing the access to a chamber using conventional valve systems is a relatively slow process. Moreover, known gate valves are not scalable. Accordingly, the inherent disadvantages of conventional methods and systems result in more down time for repairs and/or replacement of worn-out items, modest volumes of product generated, and decreased cost-effectiveness.

BRIEF SUMMARY OF THE INVENTION

It is therefore an object of this invention to provide an improved, more durable, more robust, highly reliable gate valve.

It is a further object of this invention to provide a gate valve which opens and closes rapidly.

It is a further object of this invention to provide a gate valve that provides scalability.

The invention results from the realization that an improved, rapid cycle, more robust, scalable gate valve is achieved with a rotary motion wherein a body with a passage through the body can be rotated to one position which aligns the passage with the access port of a chamber and rotated to a second position where the passage is not aligned with the access port whereupon the body is translated to seal against the access port.

This invention features a rotary barrel gate valve comprising a body and at least one passage through the body defining an inlet and an outlet, a first actuator for rotating the body, a second actuator for translating the body, and a sealing portion on the body for sealing the body with respect to an opening into a chamber adjacent the body. The sealing portion may be an O-ring disposed in a groove formed in the body and the groove may be located in opposing flats formed on a surface of the body. The portion of the body between the opposing flats may have a curvature to form an article stopping surface. The first actuator alternately rotates the body to align the sealing portion with the opening into the chamber and to align the passage with the opening into the chamber. The second actuator may urge the sealing portion against the opening into the chamber. The second actuator may urge the sealing portion away from the opening into the chamber. In one embodiment, the second actuator is a pneumatic cylinder and the first actuator is a servo motor. The second actuator may utilize a lead screw or other mechanical device for linear translation. The first actuator may also be a pneumatic rotary actuator or a cam rotary actuator. The passage through the body may include at least one track thereon, and the body may include a plurality of passages therethrough. The plurality of passages in the body may each include at least one track or the plurality of passages in the body may each include a plurality of parallel tracks. The body may be cylindrical and solid. The passage through the body may have a oblong shape. There may be a housing surrounding the body.

This invention also features a rotary barrel gate valve including a body and at least one passage through the body defining an inlet and an outlet, a sealing portion on the body comprising an O-ring disposed in a groove formed in the body. The groove may be located in flats on a surface of the body, and a portion of the body between the opposing flats may have a curvature to form an article stopping surface. A first actuator may rotate the body to align the sealing portion with an opening into a chamber adjacent the body, and a second actuator may move the sealing portion against the opening into the chamber.

This invention also features a rotary barrel gate valve having a body including a plurality of passages therethrough defining a plurality of inlets and outlets, the plurality of passages each including a plurality of parallel tracks, and a first actuator for rotating the body to align the plurality of outlets with corresponding openings into an adjacent chamber.

This invention further features a rotary barrel gate valve comprising a body including a plurality of passages therethrough defining a plurality of inlets and outlets, the plurality of passages each including a plurality of parallel tracks, a first actuator for rotating the body to align the plurality of inlets with corresponding openings into an adjacent chamber.

This invention further features a rotary barrel gate valve having a body, a plurality of passages through the body defining a plurality of inlets and outlets, each of the plurality of passages including a plurality of tracks, and a sealing portion on the body for sealing the body with respect to an opening into a chamber adjacent the body.

This invention also features a rotary barrel gate valve including a body and at least one passage through the body defining an inlet and an outlet, means for rotating the body, means for translating the body, and means for sealing the body with respect to an opening into a chamber adjacent the body. The means for sealing may be an O-ring disposed in a groove formed in the body and the groove may be located in opposing flats formed on a surface of the body. The portion of the body between the opposing flats may have a curvature to form an article stopping surface. The means for rotating may alternately rotate the body to align the means for sealing with the opening into the chamber and to align the passage with the opening into the chamber. The means for translating may urge the means for sealing against the opening into the chamber or the means for translating may urge the means for sealing away from the opening into the chamber. The means for rotating may be a first actuator. The means for translating may be a second actuator. The first actuator may be a servo motor and the second actuator may be a pneumatic cylinder.

In one embodiment, the passage through the body may include at least one track thereon. The body may include a plurality of passages therethrough. The plurality of passages in the body may each include at least one track. Preferably, the plurality of passages in the body each include a plurality of parallel tracks. The body may be cylindrical and solid. The passage through the body may have an oblong shape and there may be a housing surrounding the body.

This invention also features a rotary barrel gate valve including a body, at least one passage through the body defining an inlet and an outlet, means for sealing including an O-ring disposed in a groove, the groove formed in the body located in flats on a surface of the body in which a portion of the body between the opposing flats has a curvature to form an article stopping surface. Means for rotating the body aligns the sealing portion with an opening into a chamber adjacent the body means for moving the sealing portion moves the sealing portion against the opening into the chamber.

This invention further features a rotary barrel gate valve including a body having a plurality of passages therethrough defining a plurality of inlets and outlets, the plurality of passages each including a plurality of parallel tracks, and means for rotating the body to align the plurality of passages with corresponding openings into an adjacent chamber.

This invention further features a method for rapid gate valve cycling, the method including providing a body having at least one passage therethrough defining an inlet and an outlet, and a sealing portion on the body for sealing the body with respect to an opening into a chamber adjacent the body, rotating the body with respect to the opening into the chamber, and translating the body with respect to the opening into the chamber. The step of rotating the body may be carried out by a first actuator. The step of translating the body may be carried out by a second actuator. The first actuator may be a servo motor and the second actuator may be a pneumatic cylinder. The sealing portion may be an O-ring disposed in a groove formed in the body and the groove may be located in opposing flats formed on a surface of the body. The portion of the body between the opposing flats may have a curvature to form an article stopping surface. Rotating the body may include alternately rotating the body to align the sealing portion with the opening into the chamber and to align the passage with the opening into the chamber. Translating the body may include urging the sealing portion against the opening into the chamber. The passage through the body may include at least one track thereon and the body may include a plurality of passages therethrough. The plurality of passages in the body may each include at least one track. The plurality of passages in the body may each include a plurality of parallel tracks. The body may be cylindrical and solid. The passage through the body may have an oblong shape and there may be a housing surrounding the body.

This invention further features a method for rapid gate valve cycling, the method including providing a body having at least one passage therethrough defining an inlet and an outlet, providing a sealing portion including an O-ring disposed in a groove formed in the body, the groove located in opposing flats on a surface of the body, rotating the body to align the sealing portion with an opening into a chamber adjacent the body, and moving the sealing portion against the opening into the chamber.

This invention also features a method for rapid gate valve cycling, the method including providing a body having a plurality of passages therethrough defining a plurality of inlets and outlets, the plurality of passages each including a plurality of parallel tracks, and rotating the body to align the plurality of passages with corresponding openings into an adjacent chamber.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
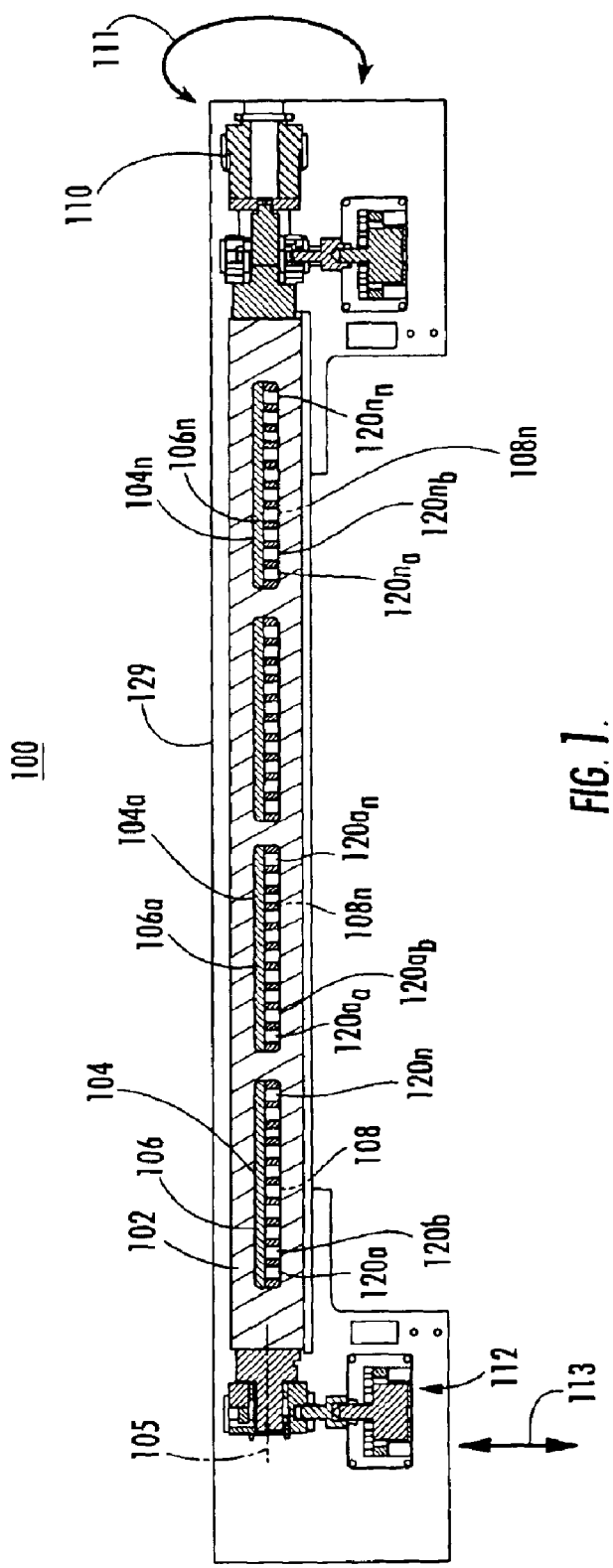
FIG. 1 is a schematic cross-sectional side view of one embodiment of a rotary barrel valve in accordance with this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

Figure 2:
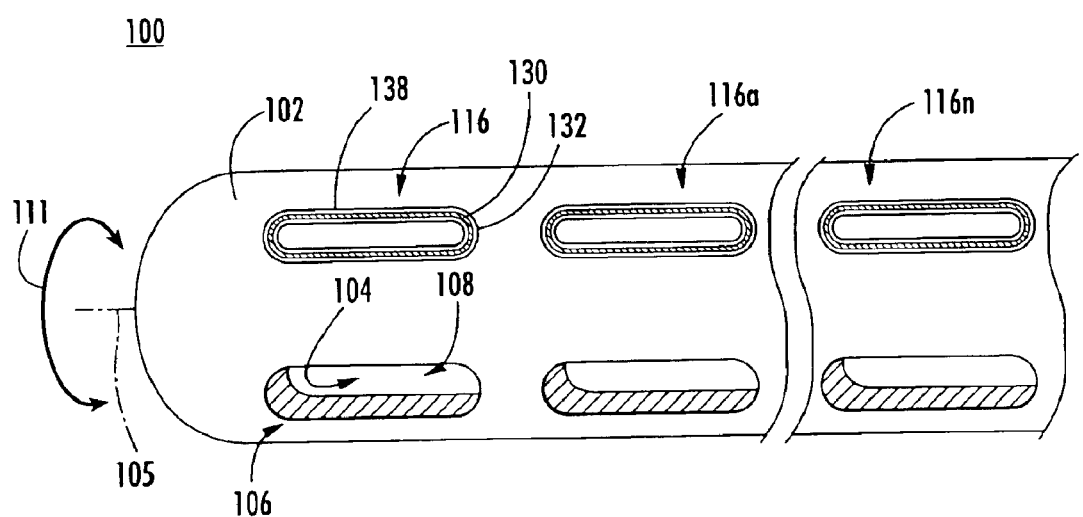
FIG. 2 is a schematic side view of one portion of the rotary barrel valve of FIG. 1.

Rotary barrel gate valve 100 in accordance with the present invention is shown schematically in FIGS. 1 and 2. Rotary barrel gate valve 100 includes body 102, and at least one passage 104 through body 102 defining inlet 106 and outlet 108. Means for rotating body 102, such as actuator 110, rotates body 102 about its axis 105, i.e. in the directions of arrow 111. Means for translating or moving body 102, such as actuator 112, translates or moves body 102 approximately linearly, i.e. in the directions of arrow 113. Means for sealing such as sealing portion 116 on body 102, FIG. 2 is for sealing body 102 with respect to an opening into a chamber adjacent body 102 (adjacent chamber not shown). In one example, body 102 is cylindrical and solid, and passage 104 through body 102 has an oblong shape. If rotary barrel gate valve 100 is adjacent a vacuum chamber, body 102 is typically surrounded by housing 129 as shown in FIG.

1. Body 102, however, could be hollow and passage 104 could be in the form of a track interconnecting an inlet and an outlet as shown in FIG. 2.

Passage 104, FIG. 1 includes at least one track or chute 120. Typically, a plurality of passages 104, 104$a$ ... 104$n$ define a plurality of inlets 106, 106$a$ ... 106$n$ and outlets 108, 108$a$ ... 108$n$. Each of the plurality of passages 104, 104$a$ ... 104$n$ includes at least one track or chute 120 therein, and preferably each passage 104, 104$a$ ... 104$n$ includes a plurality of tracks or chutes 120, 120$_a$ ... 120$_n$, 120$a_a$, 120$a_b$ ... 120$a_n$, ... 120$n_a$, 120$n_b$ ... 120$n_n$. Such an embodiment also includes a plurality of sealing portions 116, 116$a$ ... 116$n$, FIG. 2. By adding length and additional passages rotary barrel gate valve 100 of this invention is scalable. This results in decreased cost to add system capacity, because adding length and passages 104 to body 102 does not require any significant changes to actuator 110 or 112.

In one embodiment, sealing portion 116, FIG. 2 which may be anywhere on body 102, is O-ring 130 disposed in groove 132 formed on surface 138 of body 102. In one preferred embodiment, body 102 will have a passage 104 corresponding to sealing portion 116 such that when body 102 is rotated, as indicated by arrow 111, passage 104 and sealing portion 116 will alternately be aligned with an opening into a chamber adjacent the body. In other embodiments, O-ring 130 may instead be located about the opening into an adjacent chamber (not shown). In either embodiment, the O-ring pushes on and off the sealing surface, maximizing the life of the surface of the O-ring.

Figure 3:
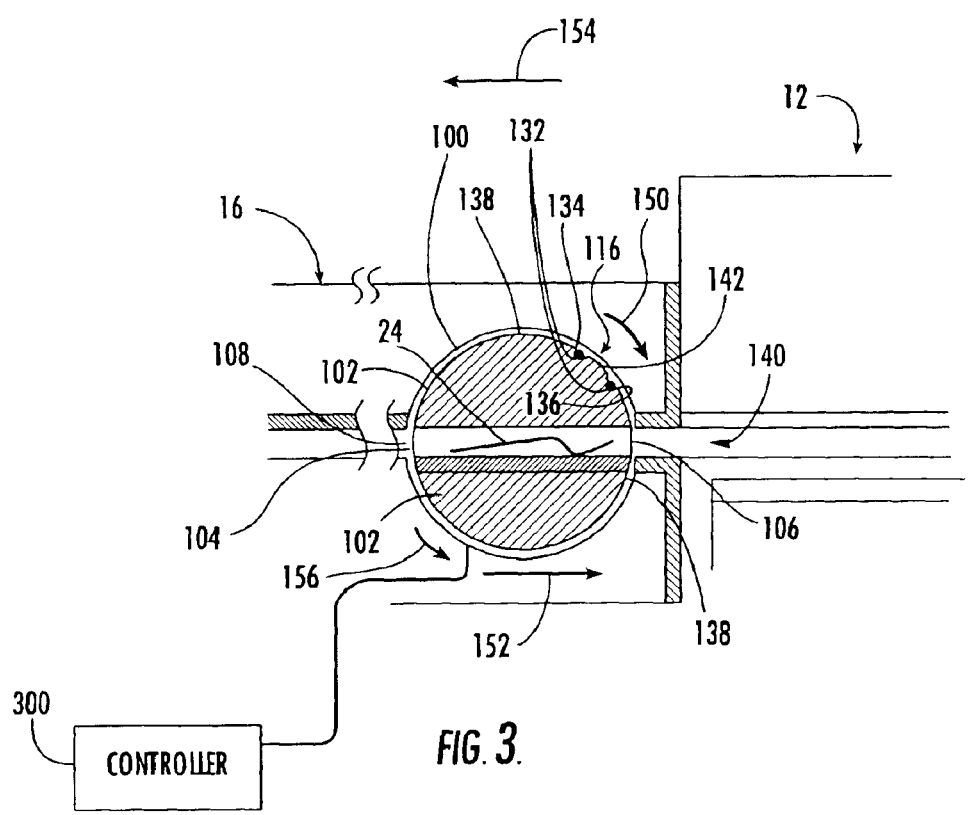
FIG. 3 is a schematic cross-sectional view of the rotary barrel gate valve of FIG. 1 in the open position.

When rotary barrel gate valve 100 is open, FIG. 3 inlet 106 in passage 104 of body 102 is aligned with opening 140 of chamber 12, allowing article 24, for example, to move from chamber 12 to output load lock 16. Controller 300 may be included for interlocking or sequencing each gate valve 100 with any other gate valves in a system to detect full closure and to allow for processing of a plurality of articles simultaneously in one track. Thus, for instance, the risk of direct passing of atmosphere into a processing chamber is minimized should an article become lodged in any gate valve. In such an event, such a system halts and an error condition is reported. Also, sequencing of multiple rotary barrel gate valves increases productivity.

Figure 4:
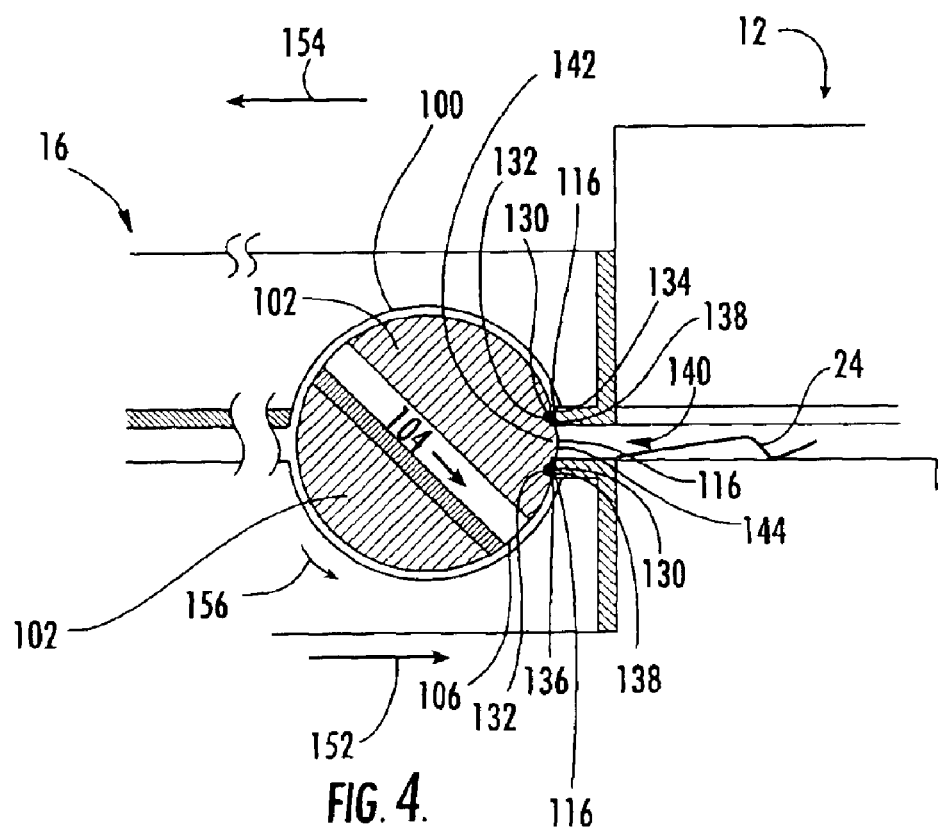
FIG. 4 is a schematic cross-sectional view of the rotary barrel gate valve of FIG. 1 in the closed position.

In accordance with the present invention, rotary barrel gate valve 100 is moved from closed, FIG. 4, to open, FIG. 3, and vice versa, by actuators 110 and 112, FIG. 1. When rotary barrel gate valve 100 is open as in FIG. 3, inlet 106 is aligned with opening 140 into chamber 12. Passage 104 now provides access through rotary barrel gate valve 100 out of chamber 12. To close rotary barrel gate valve 100, actuator 110, FIG. 1 rotates body 102 in the direction of arrow 150, FIG. 3 to align sealing portion 116 with opening 140. Now, passage 104, FIG. 4 is not aligned with opening 140. Immediately thereafter, actuator 112, FIG. 1 moves or translates sealing portion 116 in the direction of arrow 152 and against opening 140. Then, to open rotary barrel gate valve 100, actuator 112 moves sealing portion 116 away from opening 140 in the direction of arrow 154, and immediately thereafter actuator 110 rotates body 102 in the direction of arrow 156 to once again align inlet 106 with opening 140 into chamber 12.

Figure 5:
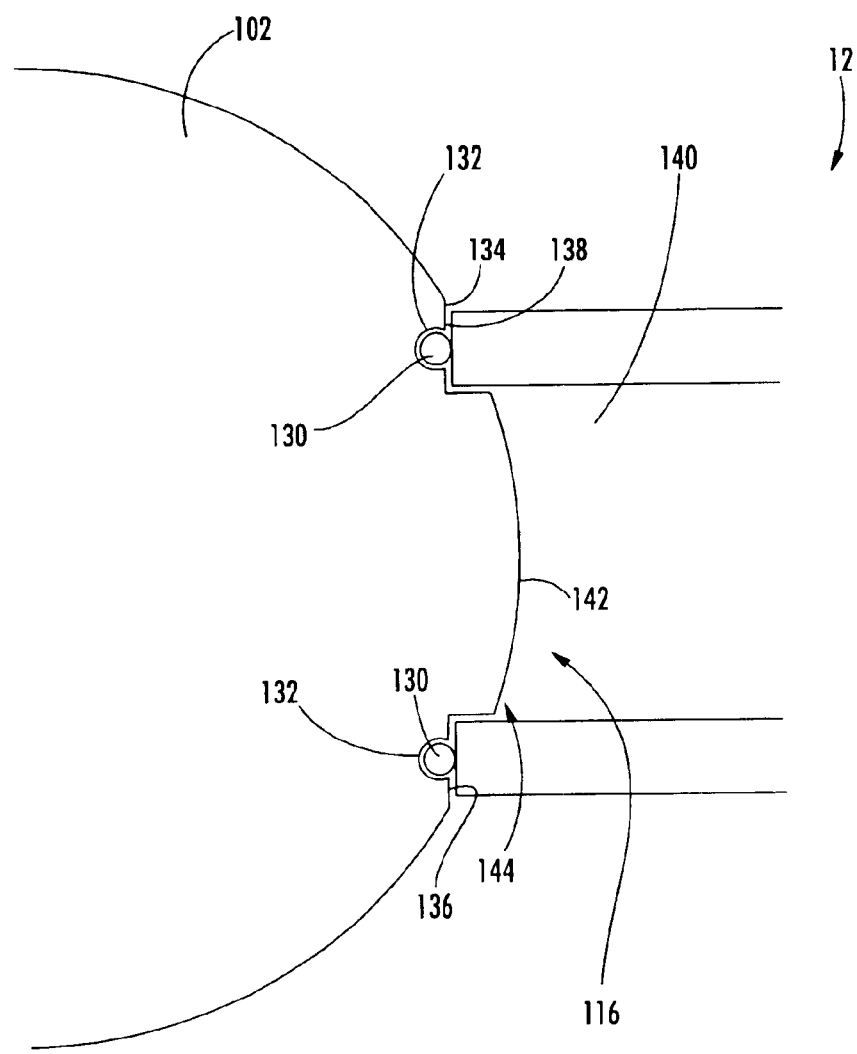
FIG. 5 is an enlarged schematic cross-sectional side view of the sealing portion of the barrel valve.

When rotary barrel gate valve 100 is closed, FIG. 5 groove 132 is located in opposing flats 134, 136 formed on surface 138 of body 102. In one embodiment, portion or nose piece 142 of body 102 projects between opposing flats 134, 136 and may have a curvature to form article stopping surface or escapement 144 for stopping article 24, for example, from proceeding from output load lock 16 to atmosphere. Conversely, when rotary barrel gate valve 100 is open, portion 142 of body 102 no longer forms article stopping surface 144.

As described herein, a "chamber" could be an input load lock or an output load lock or atmosphere, and the term "chamber" as used herein is not necessarily limited to a processing chamber. For example, in FIG. 4, rotary barrel gate valve 100 seals chamber 12, e.g. a processing chamber, with respect to output load lock 16. However, in another example, rotary barrel gate valve 18', FIG. 1 seals input load lock "chamber" 14 from atmosphere.

Figure 6:
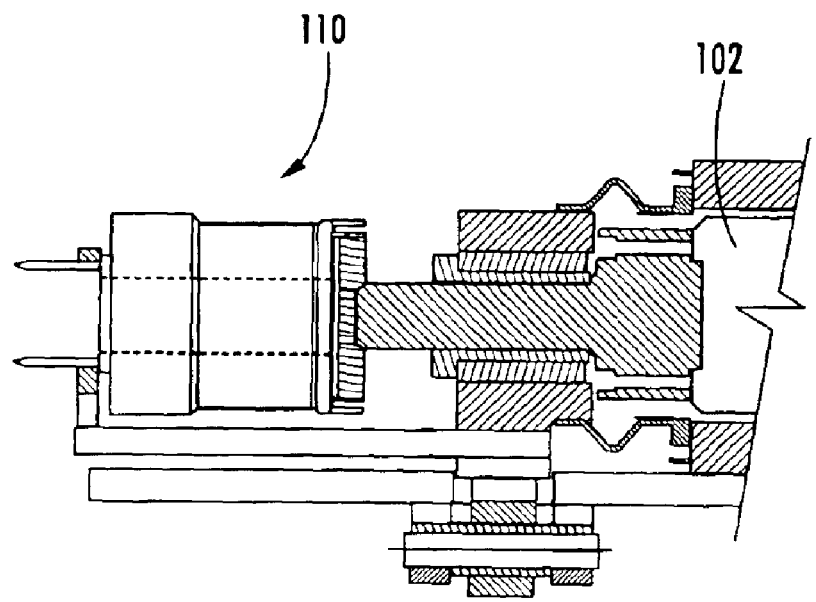
FIG. 6 is a schematic cross-sectional view of an actuator for translating the rotary barrel gate valve.
Figure 7:
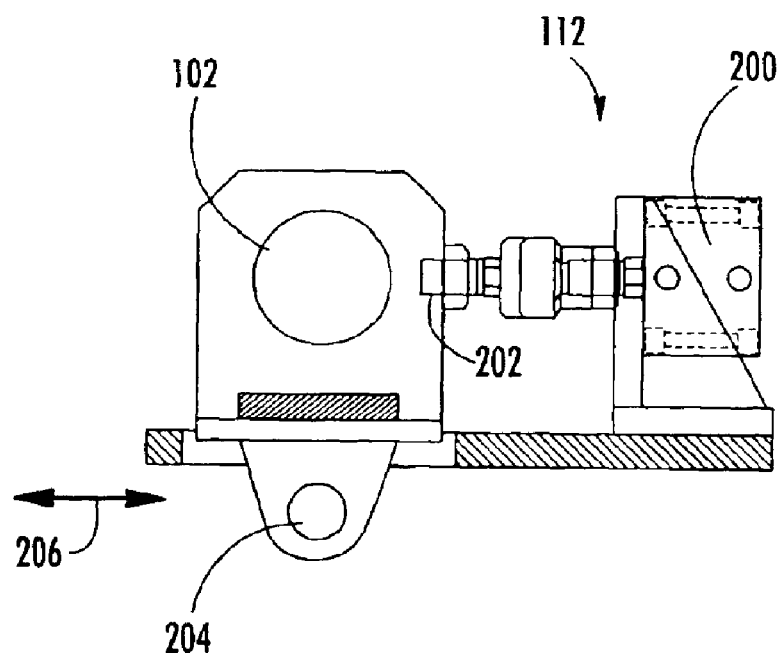
FIG. 7 is a schematic cross-sectional view of an actuator for rotating the rotary barrel gate valve.

Actuator 110 may be a pneumatic rotary actuator or a cam rotary actuator. In one preferred embodiment, actuator 110, FIG. 6 is a servo motor connected to body 102 for rotating body 102. Actuator 110 alternately rotates body 102 to align sealing portion 116, FIG. 4 with, for example, opening 140 into chamber 12, and to align passage 104 with opening 140 into chamber 12, FIG. 3. Actuator 112, FIG. 7 is typically a pneumatic cylinder 200. When activated, pneumatic cylinder 200 of actuator 112 projects (or retracts) push pin 202 which causes body 102 to pivot around pivot point 204 in the directions of arrow 206, thus urging or translating body 102 approximately linearly, for example, toward and away from chamber 12, as shown in FIGS. 3 and 4. In this embodiment, body 102 moves approximately linearly but in a very slight arc. The second actuator may utilize a lead screw or other mechanical device for linear translation (not shown). The servo motor and the short stroke of actuator 112 permit very fast gate valve opening and closing times. With the rotary barrel gate valve of this invention cycles times of 350 milliseconds have been achieved.

Figure 8:
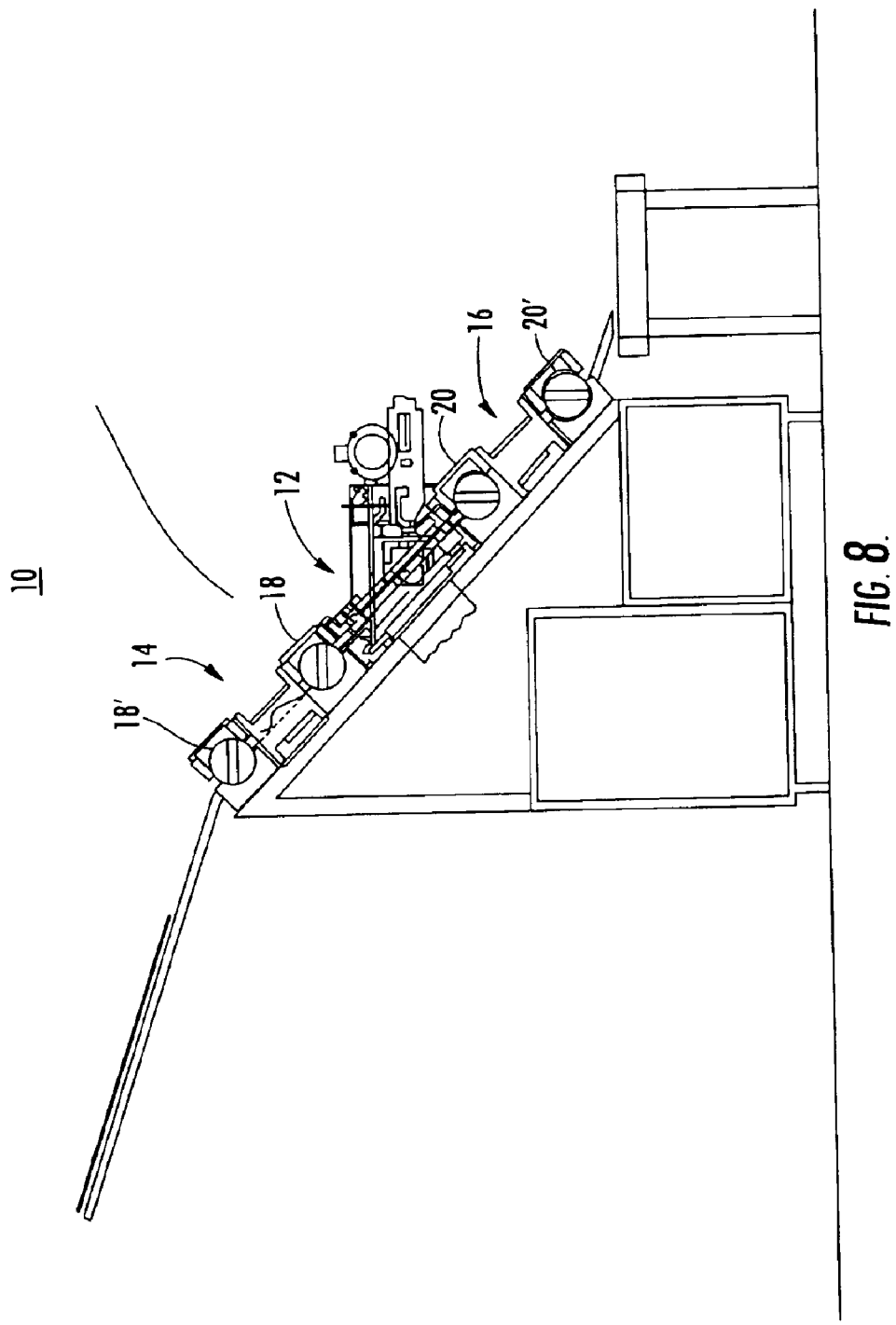
FIG. 8 is a schematic view of rotary barrel gate valves of this invention in a gravity-fed in-line continuous processing system.

Rotary barrel gate valves in accordance with this invention are useful in the invention disclosed in the co-pending patent application entitled GRAVITY-FED IN-LINE CONTINUOUS PROCESSING SYSTEM filed on even date herewith. Rotary barrel gate valves in accordance with this invention, namely rotary barrel gate valves 18, 18', 20' and 20, FIG. 8 are shown as used in one embodiment of gravity-fed in-line continuous processing system 10. As shown, rotary barrel gate valve 18' and 18 are part of input load lock 14 between processing chamber 12 and output load lock 16, where output lock 16 includes rotary barrel gate valves 20 and 20'.

The rotary barrel gate valve of the present invention is more robust, more durable and highly reliable. It opens and closes more rapidly than conventional valves, and it results in higher productivity and less down time. Additionally, the rotary barrel gate valve of this invention allows for scalability without the need for additional actuators. Another feature of the rotary barrel gate valve of this invention is that it may be used to accomplish part inversion, i.e. to flip an article 180° from its original orientation for additional coating or cooling of the article as needed for a particular processing application.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A rotary barrel gate valve comprising:
   a body;
   a plurality of passages through the body defining a plurality of inlets and outlets, the plurality of passages each including a plurality of parallel tracks therein;
   a first actuator for rotating the body;
   a second actuator for translating the body; and
   a plurality of sealing portions on the body, the plurality of sealing portions corresponding to each of the passages for sealing the body with respect to openings into a chamber adjacent the body.

2. The rotary barrel gate valve of claim 1 in which the sealing portions are O-rings disposed in grooves formed in the body.

3. The rotary barrel gate valve of claim 2 in which the grooves are located in opposing flats formed on a surface of the body.

4. The rotary barrel gate valve of claim 3 in which a portion of the body between the opposing flats has a curvature to form an article stopping surface.

5. The rotary barrel gate valve of claim 1 in which the first actuator alternately rotates the body to align the sealing portions with the openings into the chamber and to align the passages with the openings into the chamber.

6. The rotary barrel gate valve of claim 1 in which the second actuator urges the sealing portions against the openings into the chamber.

7. The rotary barrel gate valve of claim 1 in which the second actuator urges the sealing portions away from the openings into the chamber.

8. The rotary barrel gate valve of claim 1 in which the second actuator is a pneumatic cylinder.

9. The rotary barrel gate valve of claim 1 in which the first actuator is a servo motor.

10. The rotary barrel gate valve of claim 1 in which the body is cylindrical.

11. The rotary barrel gate valve of claim 1 in which the body is solid.

12. The rotary barrel gate valve of claim 1 in which the passages through the body have an oblong shape.

13. The rotary barrel gate valve of claim 1 further including a housing surrounding the body.

14. A rotary barrel gate valve comprising:
    a body;
    a plurality of passages through the body defining a plurality of inlets and outlets, the plurality of passages each including a plurality of parallel tracks therein;
    a plurality of sealing portions on the body, one sealing portion corresponding to each of the passages, the sealing portions each comprising an O-ring disposed in a groove formed in the body, the groove located in flats on a surface of the body;
    an article stopping surface formed in a portion of the body between the opposing flats;
    a first actuator for rotating the body to align the plurality of sealing portions with openings into a chamber adjacent the body; and
    a second actuator for moving the plurality of sealing portions against the openings into the chamber.

15. A rotary barrel gate valve comprising:
    a body including a plurality of passages therethrough defining a plurality of inlets and outlets, the plurality of passages each including a plurality of parallel tracks therein;
    a first actuator for rotating the body to align the plurality of outlets with corresponding openings into an adjacent chamber; and
    a plurality of sealing portions on the body, one sealing portion corresponding to each of the passages for sealing the body with respect to the openings into a chamber adjacent the body.

16. A rotary barrel gate valve comprising:
    a body including a plurality of passages therethrough defining a plurality of inlets and outlets, the plurality of passages each including a plurality of parallel tracks;
    an actuator for translating the body; and
    a plurality of sealing portions on the body, one sealing portion corresponding to each of the passages for sealing the body with respect to openings into a chamber adjacent the body.

17. A rotary barrel gate valve comprising:
    a solid cylindrical body;
    a plurality of passages through the body defining a plurality of inlets and outlets;
    a first actuator for rotating the body;
    a second actuator for translating the body; and
    a plurality of discrete sealing portions on the body, each discrete sealing portion corresponding to a passage for sealing the body with respect to openings into a chamber adjacent the body.

18. A rotary barrel gate valve comprising:
    a body;
    a plurality of passages through the body defining a plurality of inlets and outlets, the plurality of passages each including a plurality of parallel tracks therein;
    means for rotating the body;
    means for translating the body; and
    means for sealing the body corresponding to the plurality of passages for sealing the body with respect to openings into a chamber adjacent the body.

19. The rotary barrel gate valve of claim 18 in which the plurality of means for sealing are O-rings disposed in grooves formed in the body.

20. The rotary barrel gate valve of claim 19 in which the grooves are located in opposing flats formed on a surface of the body.

21. The rotary barrel gate valve of claim 20 in which a portion of the body between the opposing flats has a curvature to form an article stopping surface.

22. The rotary barrel gate valve of claim 18 in which the means for rotating alternately rotates the body to align the plurality of means for sealing with the openings into the chamber and to align the passages with the openings into the chamber.

23. The rotary barrel gate valve of claim 18 in which the means for translating urges the plurality of means for sealing against the openings into the chamber.

24. The rotary barrel gate valve of claim 18 in which the means for translating urges the plurality of means for sealing away from the openings into the chamber.

25. The rotary barrel gate valve of claim 18 in which the means for rotating is a first actuator.

26. The rotary barrel gate valve of claim 25 in which the first actuator is a servo motor.

27. The rotary barrel gate valve of claim 18 in which the means for translating is a second actuator.

28. The rotary barrel gate valve of claim 27 in which the means for translating is a pneumatic cylinder.

29. The rotary barrel gate valve of claim 18 in which the body is cylindrical.

30. The rotary barrel gate valve of claim 18 in which the body is solid.

31. The rotary barrel gate valve of claim 18 in which the passage through the body has a oblong shape.

32. The rotary barrel gate valve of claim 18 further including a housing surrounding the body.

33. A rotary barrel gate valve comprising:
a body;
a plurality of passages through the body defining a plurality of inlets and outlets, the plurality of passages each including a plurality of parallel tracks;
means for sealing corresponding to each of the passages each including an O-rings disposed in a groove formed in the body, the groove located in flats on a surface of the body in which a portion of the body between the opposing flats has a curvature to form an article stopping surface;
means for rotating the body to align the plurality of sealing portions with openings into a chamber adjacent the body; and
means for moving the plurality of sealing portions against the openings into the chamber.

34. A method for rapid gate valve cycling, the method comprising:
providing a body having a plurality of passages therethrough defining a plurality of inlets and outlets, the plurality of passages each including a plurality of parallel tracks therein, and a plurality of sealing portions on the body, a sealing portion corresponding to each of the passages for sealing the body with respect to openings into a chamber adjacent the body;
rotating the body with respect to openings into the chamber; and
translating the body with respect to openings into the chamber.

35. The method of claim 34 in which the step of rotating the body is carried out by a first actuator.

36. The method of claim 35 in which the first actuator is a servo motor.

37. The method of claim 34 in which the step of translating the body is carried out by a second actuator.

38. The method of claim 37 in which the second actuator is a pneumatic cylinder.

39. The method of claim 34 in which the plurality of sealing portions are O-rings disposed in grooves formed in the body.

40. The method of claim 39 in which the grooves are located in opposing flats formed on a surface of the body.

41. The method of claim 40 in which a portion of the body between the opposing flats has a curvature to form an article stopping surface.

42. The method of claim 40 in which the step of rotating the body includes alternately rotating the body to align the plurality of sealing portions with the openings into the chamber and to align the passages with the openings into the chamber.

43. The method of claim 34 in which the step of translating the body includes urging the plurality of sealing portions against the openings into the chamber.

44. The method of claim 34 in which the body is cylindrical.

45. The method of claim 34 in which the body is solid.

46. The method of claim 34 in which the passage through the body has an oblong shape.

47. The method of claim 34 further including a housing surrounding the body.

48. A method for rapid gate valve cycling, the method comprising:
providing a body having a plurality of passages therethrough defining a plurality of inlets and outlets, the plurality of passages each including a plurality of parallel tracks therein;
providing a plurality of sealing portions each including an O-rings disposed in a groove, the groove formed in opposing flats on a surface of the body;
rotating the body to align the plurality of sealing portions with openings into a chamber adjacent the body; and
moving the plurality of sealing portions against the openings into the chamber.

* * * * *